US009373367B1

(12) United States Patent
Kim et al.

(10) Patent No.: US 9,373,367 B1
(45) Date of Patent: Jun. 21, 2016

(54) DATA STORAGE DEVICE AND OPERATING METHOD THEREOF

(71) Applicant: SK hynix Inc., Gyeonggi-do (KR)

(72) Inventors: Sang Sik Kim, Gyeonggi-do (KR); Jae Yoon Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/657,645

(22) Filed: Mar. 13, 2015

(30) Foreign Application Priority Data

Jan. 15, 2015 (KR) .................. 10-2015-0007473

(51) Int. Cl.
G11C 7/00 (2006.01)
G11C 16/08 (2006.01)
G11C 16/16 (2006.01)
G11C 7/20 (2006.01)
G11C 11/56 (2006.01)

(52) U.S. Cl.
CPC .. G11C 7/00 (2013.01); G11C 7/20 (2013.01); G11C 16/08 (2013.01); G11C 16/16 (2013.01); G11C 11/5635 (2013.01)

(58) Field of Classification Search
CPC .......... G11C 7/00; G11C 16/16; G11C 16/08; G11C 16/10; G11C 7/20; G11C 11/5635
USPC ............................. 365/218, 189.01
See application file for complete search history.

(56) References Cited

U.S. PATENT DOCUMENTS

| 7,593,267 | B2 | 9/2009 | Fujiu et al. | |
| 8,116,141 | B2* | 2/2012 | Yoo | G11C 16/3427 365/185.02 |
| 8,493,781 | B1 | 7/2013 | Meir et al. | |
| 8,576,621 | B2* | 11/2013 | Kang | G11C 5/147 365/185.03 |
| 8,582,365 | B2* | 11/2013 | Kim | G11C 11/5642 365/185.18 |
| 8,738,836 | B2 | 5/2014 | Yano | |
| 8,743,604 | B2* | 6/2014 | Chae | G11C 11/5628 365/185.03 |
| 8,908,460 | B2* | 12/2014 | Mun | G11C 11/56 365/189.011 |
| 2015/0179272 | A1* | 6/2015 | Kim | G11C 29/56 365/185.03 |

FOREIGN PATENT DOCUMENTS

KR 1020100114970 10/2010

* cited by examiner

*Primary Examiner* — Pho M Luu
(74) *Attorney, Agent, or Firm* — IP & T Group LLP

(57) ABSTRACT

A data storage device may include: a nonvolatile memory device including first and second memory cells adjacent to each other; and a controller suitable for performing a distribution adjusting operation for adjusting a threshold voltage of the second memory cell based on whether a read operation on the first memory cell fails.

18 Claims, 14 Drawing Sheets

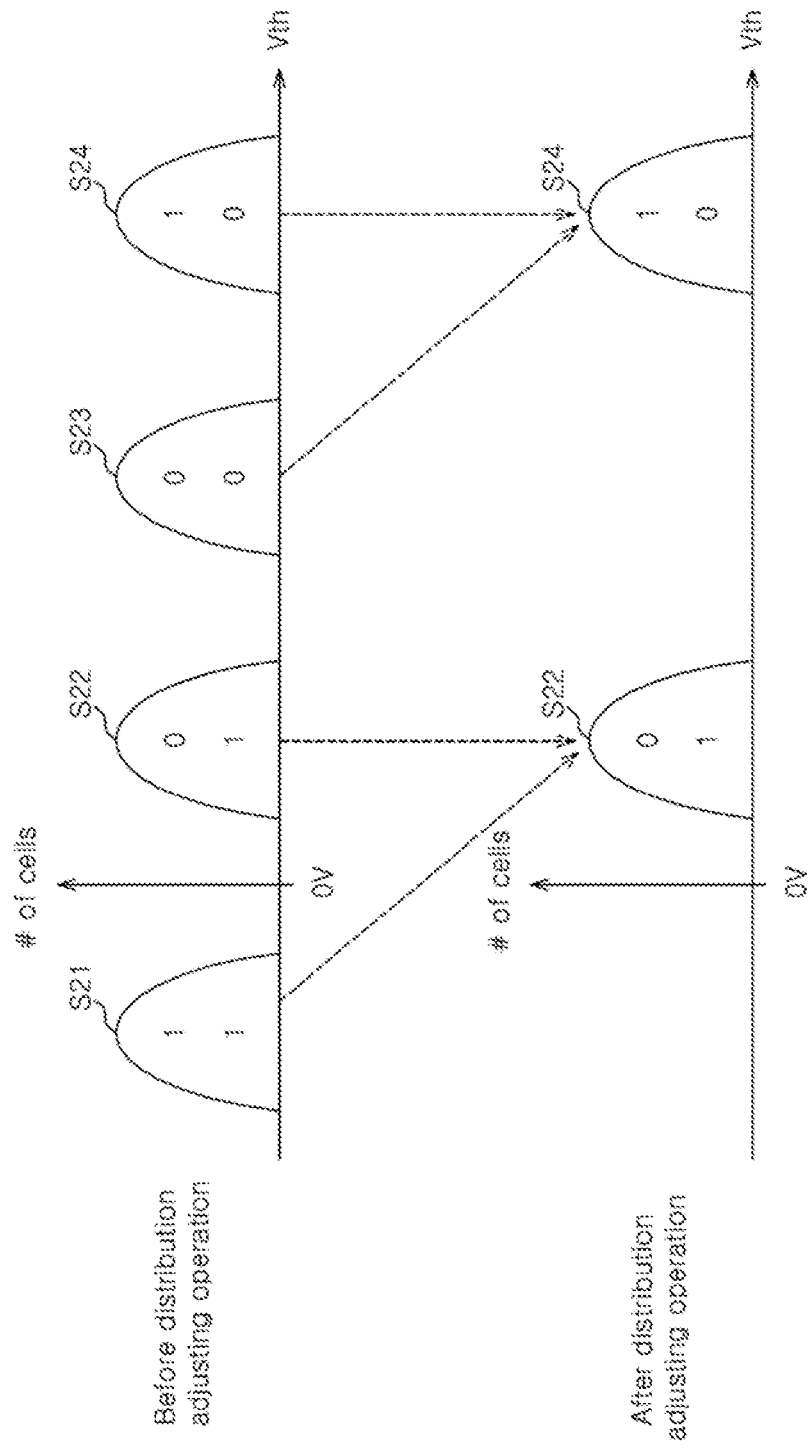

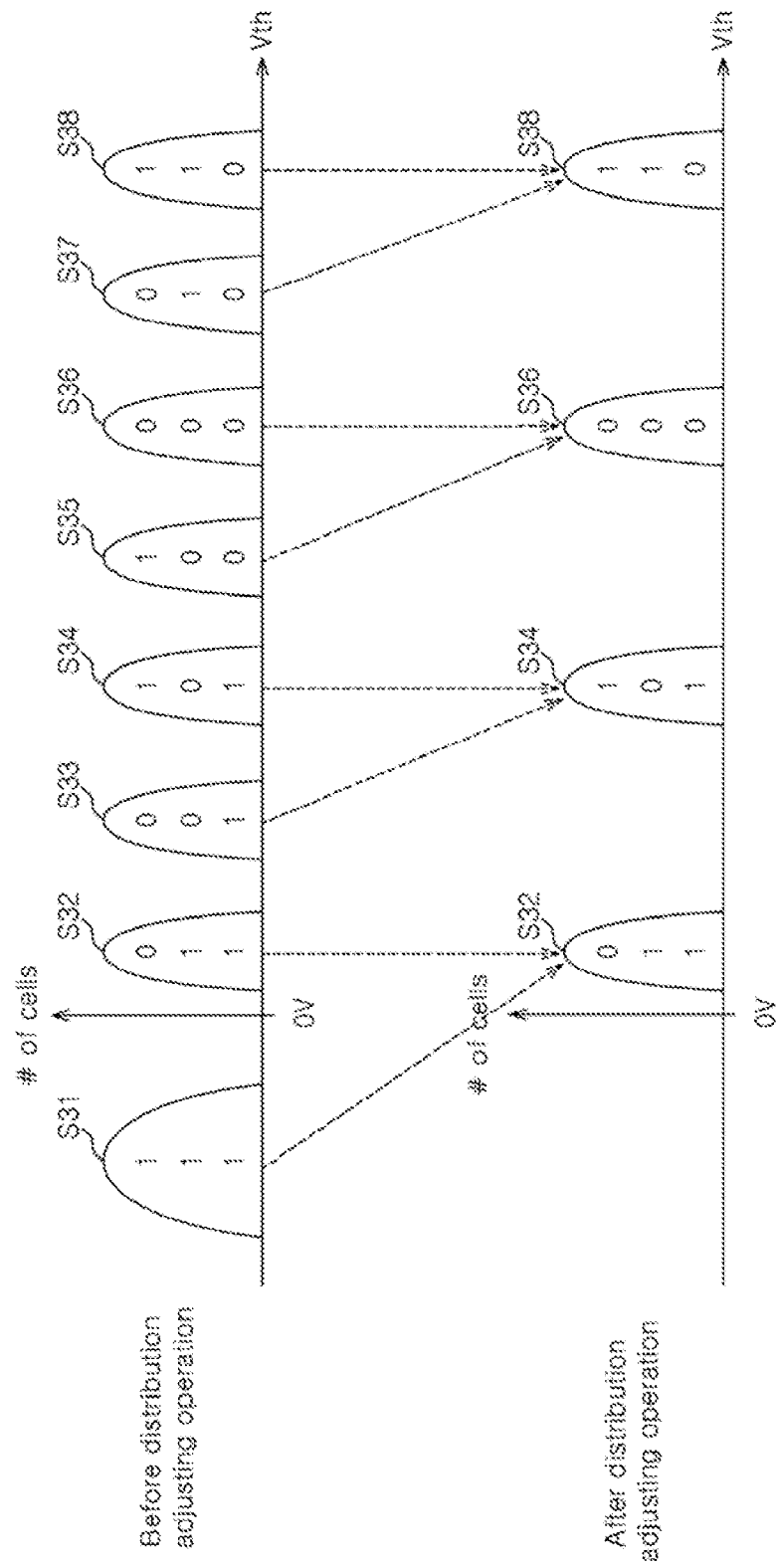

FIG.9A

| Read data | 11 | 01 | 00 | 10 |
|---|---|---|---|---|
| Adjusted data | 01 | 01 | 10 | 10 |

FIG.9B

| Read data | 111 | 011 | 001 | 101 | 100 | 000 | 010 | 110 |
|---|---|---|---|---|---|---|---|---|
| Adjusted data | 011 | 011 | 101 | 101 | 000 | 000 | 110 | 110 |

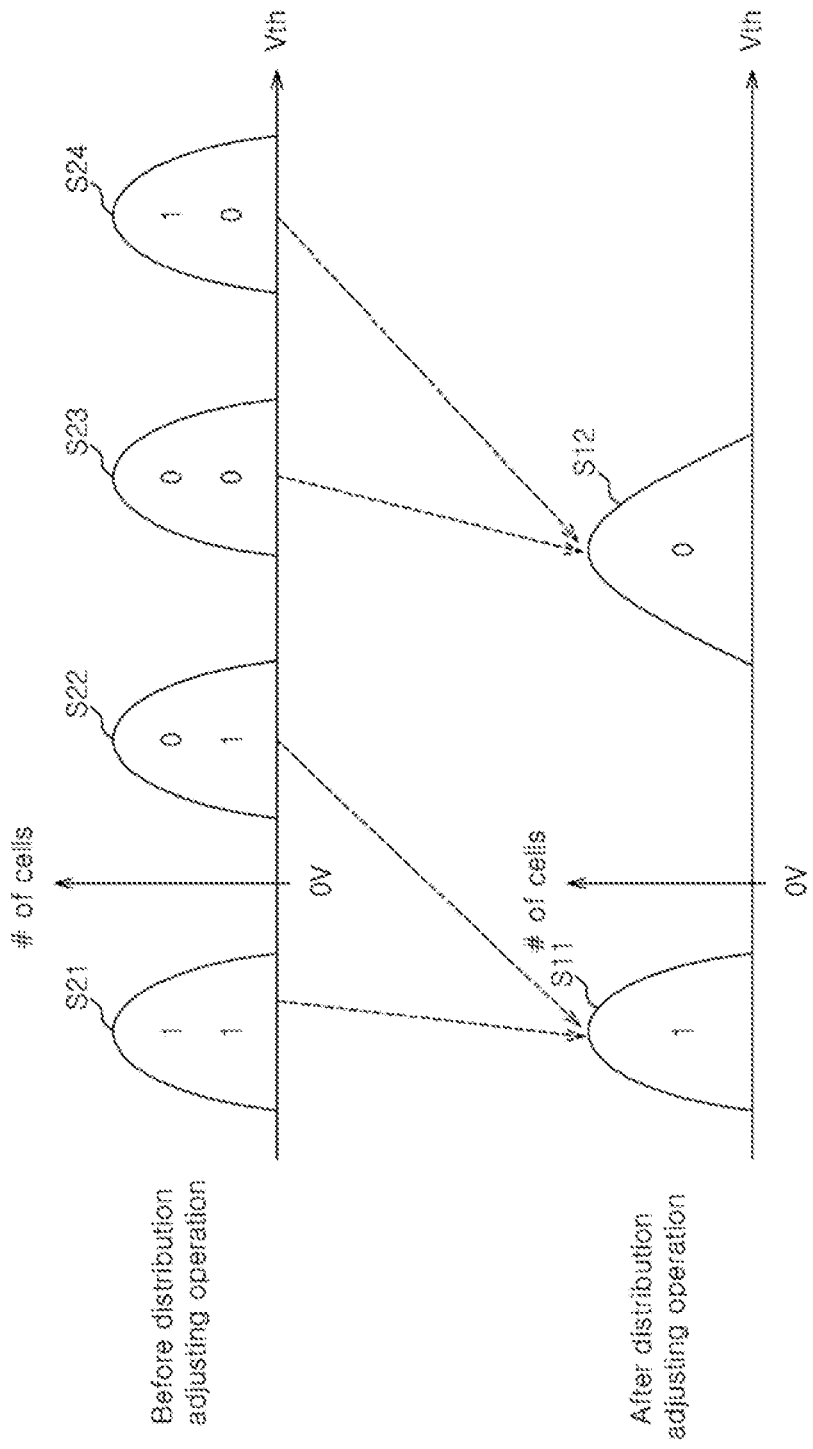

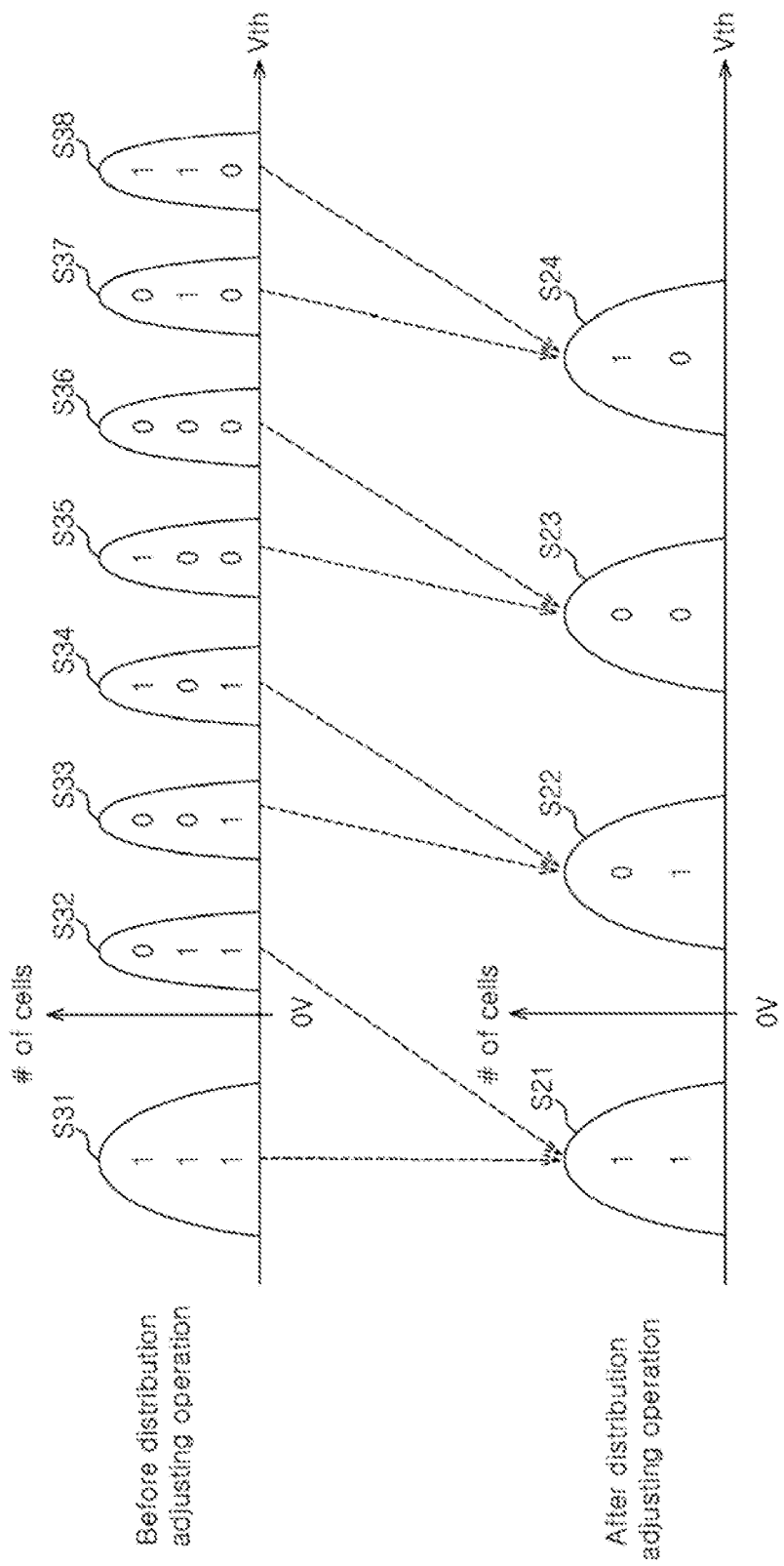

FIG.11A

| Read data | 11 | 01 | 00 | 10 |
|---|---|---|---|---|
| Adjusted data | 1 | 1 | 0 | 0 |

FIG.11B

| Read data | 111 | 011 | 001 | 101 | 100 | 000 | 010 | 110 |
|---|---|---|---|---|---|---|---|---|
| Adjusted data | 11 | 11 | 01 | 01 | 00 | 00 | 10 | 10 |

DATA STORAGE DEVICE AND OPERATING METHOD THEREOF

CROSS-REFERENCES TO RELATED APPLICATION

The present application claims priority under 35 U.S.C. §119(a) to Korean application number 10-2015-0007473, filed on Jan. 15, 2015, in the Korean Intellectual Property Office, which is incorporated herein by reference in its entirety.

BACKGROUND

1. Technical Field

Various embodiments relate to a data storage device and, more particularly, to a data storage device capable of correcting errors of data stored therein.

2. Related Art

A semiconductor memory device may be used to store data. Semiconductor memory devices may be divided into nonvolatile and volatile memory devices.

Nonvolatile memory devices maintain data stored therein even without a constant source of power. Nonvolatile memory devices include flash memory devices such as NAND flash or NOR flash, Ferroelectrics Random Access Memory (FeRAM), Phase-Change Random Access Memory (PCRAM), Magnetoresistive Random Access Memory (MRAM) or Resistive Random Access Memory (ReRAM).

Volatile memory devices fail to maintain data stored therein without a constant source of power. Volatile memory devices include Static Random Access Memory (SRAM) and Dynamic Random Access Memory (DRAM). Volatile memory devices are generally used as buffer memory devices, cache memory devices, or working memory devices in data processing systems, due to their relatively high processing speed.

SUMMARY

Various embodiments are directed to a data storage device capable of correcting an error of data that occurs due to interference effects between memory cells.

In an embodiment of the present invention, a data storage device may include: a nonvolatile memory device including first and second memory cells adjacent to each other; and a controller suitable for performing a distribution adjusting operation for adjusting a threshold voltage of the second memory cell, based on whether a read operation on the first memory cell fails.

In an embodiment of the present invention, an operating method of a data storage device may include: performing a read operation on a first memory cell; and performing a distribution adjusting operation for adjusting a threshold voltage of a second memory cell adjacent to the first memory cell based on whether the read operation fails.

In an embodiment of the present invention, an operating method of a data storage device may include: performing a read operation on a first memory cell; and changing data stored in a second memory cell adjacent to the first memory cell based on whether the read operation fails.

BRIEF DESCRIPTION OF THE DRAWINGS

Features, aspects, and embodiments are described in conjunction with the attached drawings, in which:

FIGS. 8A and 8B illustrate changes in threshold voltage distributions of adjacent memory cells through a distribution adjusting operation according to an embodiment of the present disclosure.

FIGS. 9A and 9B are tables showing read data and adjusted data for the distribution adjusting operation illustrated in FIGS. 8A and 8B;

FIGS. 10A and 10B illustrate changes in threshold voltage distributions of adjacent memory cells through a distribution adjusting operation according to an embodiment of the present disclosure;

FIGS. 11A and 11B are tables showing read data and adjusted data for the distribution adjusting operation shown in FIGS. 10A and 10B;

DETAILED DESCRIPTION

Figure 1:
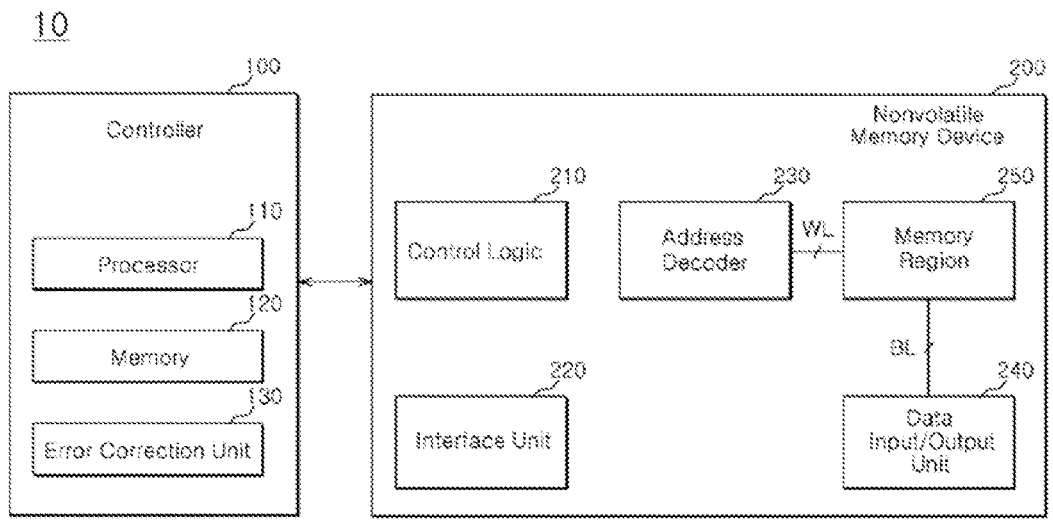
FIG. 1 is a block diagram illustrating a data storage device according to an embodiment of the present disclosure.

Hereinafter, a data storage device and an operating method thereof according to the present invention will be described with reference to the accompanying drawings through exemplary embodiments of the present invention. The present invention may, however, be embodied in different forms and should not be construed as limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

FIG. 1 is a block diagram illustrating a data storage device 10 according to an embodiment of the present disclosure.

Referring to FIG. 1, the data storage device 10 may be configured to store data provided from an external device in response to a write request from the external device. Furthermore, the data storage device 10 may be configured to provide data stored therein to the external device in response to a read request from the external device. The external device is an electronic device capable of processing data, and may include a computer, a digital camera, or a mobile phone. The data storage device 10 may be mounted in the external device. Alternatively, the data storage device 10 may be fabricated separately and operate when coupled to the external device.

The data storage device 10 may be configured by a Personal Computer Memory Card International Association (PCMCIA) card, a compact flash (CF) card, a smart media card, a memory stick, a multimedia card (MMC), an embedded MMC (eMMC), a reduced-size multimedia card (RS-MMC) and a micro-size version of MMC (MMC-micro) a secure digital (SD) card, a mini secure digital (mini-SD) and a micro secure digital (micro-SD), a universal flash storage (UFS), or a solid state drive (SSD).

The data storage device 10 may include a controller 100 and a nonvolatile memory device 200.

The controller 100 may include a processor 110, a memory 120, and an error correction unit 130.

The processor 110 may control overall operations of the data storage device 10. The processor 110 may control a write or read operation of the nonvolatile memory device 200 in response to the write or read request from the external device. The processor 110 may generate a command for controlling the operation of the nonvolatile memory device 200, and provide the generated command to the nonvolatile memory device 200. The processor 110 may drive a software program on the memory 120 to control the operation of the data storage device 10.

When a read fail (i.e. a read operation fails to execute properly) for a target word line occurs, the processor 110 may perform a distribution adjusting operation on word lines adjacent to the target word line, in order to improve or remove interference effects. The distribution adjusting operation of the processor 110 will be described below in detail.

The memory 120 may serve as a working memory, a buffer memory, or a cache memory of the processor 110. The memory 120 may serve as the working memory which stores various program data and a software program driven by the processor 110. The memory 120 may serve as the buffer memory which buffers data transmitted between the external device and the nonvolatile memory device 200. The memory 120 may serve as the cache memory which temporarily stores cache data.

The error correction unit 130 may encode data before the data are stored in the nonvolatile memory device 200 based on the write request from the external device. Thus, the error correction unit 130 may determine whether an error occurred in the data and correct the error later. The error correction unit 130 may decode the encoded data when the encoded data are read from the nonvolatile memory device 200 based on the read request from the external device. Then, the error correction unit 130 may detect and correct errors that may occur in the corresponding data.

The nonvolatile memory device 200 may include a control logic 210, an interface unit 220, an address decoder 230, a data input/output unit 240, and a memory region 250.

The control logic 210 may control overall operations of the nonvolatile memory device 200. The control logic 210 may control a write, read, or erase operation on the memory region 250 in response to an access command provided from the controller 100, for example, a write, read, or erase command.

The interface unit 220 may exchange data and various control signals including the access command with the controller 100. The interface unit 220 may transmit the various control signals and data to internal units of the nonvolatile memory device 200.

The address decoder 230 may decode a row address and a column address. The address decoder 230 may control word lines WL to be selectively driven based on the decoded row address. The address decoder 230 may control the data input/output unit 240 to selectively drive the bit lines BL based on the decoded column address.

The data input/output unit 240 may transmit the data received from the interface unit 220 to the memory region 250 through the bit lines BL. The data input/output unit 240 may transmit data read from the memory region 250 through the bit lines BL to the interface unit 220.

The memory region 250 may include a plurality of memory cells arranged at the respective intersections between the word lines WL and the bit lines BL. The memory region 250 may include a plurality of memory blocks, and each of the memory blocks may include a plurality of pages.

Figure 2:
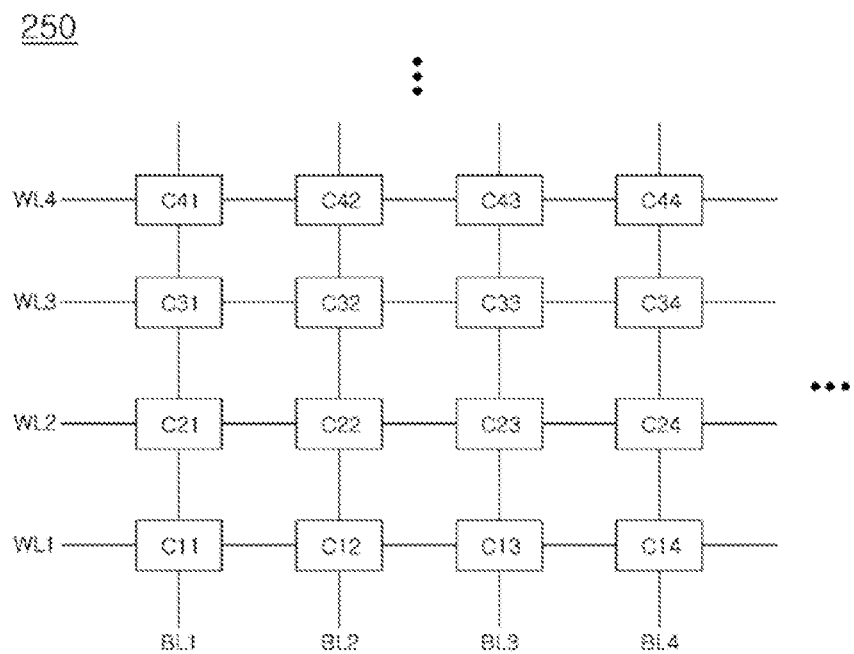
FIG. 2 is a diagram illustrating a memory region of FIG. 1.

FIG. 2 is a diagram illustrating the memory region 250 of FIG. 1.

Referring to FIG. 2, the memory region 250 may include a plurality of memory cells C11 to C14, C21 to C24, C31 to C34, and C41 to C44 arranged at the respective intersections between first to fourth word lines WL1 to WL4 and first to fourth bit liens BL1 to BL4. Each of the memory cells C11 to C14, C21 to C24, C31 to C34, and C41 to C44 may be accessed when the corresponding word line and bit line are selected. When a write or read operation is performed on a word line, it may indicate that the write or read operation is performed on a memory cell coupled to the word line.

A target word line may indicate a word line on which a write or read operation is performed, and adjacent word lines may indicate word lines adjacent to the target word line. Memory cells coupled to the target word line may be referred to as target memory cells, and memory cells coupled to the adjacent word lines may be referred to as adjacent memory cells. For example, when a target word line is the second word line WL2 and target memory cells are the memory cells C21 to C24, adjacent word lines may be set to the first and third word line WL1 or WL3, and adjacent memory cells may be set to the memory cells C11 to C14 and C31 to C34.

When the memory cells are implemented with single-level cells, each configured to store one-bit data, each of the word lines WL1 to WL4 may correspond to one page. When the memory cells are implemented with multi-level cells, each configured to store multi-bit data, each of the word lines WL1 to WL4 may correspond to multiple pages. For example, when the memory cells are implemented with multi-level cells, each configured to store two-bit data, each of the word lines WL1 to WL4 may correspond to a Least Significant Bit (LSB) page to store LSB data and a Most. Significant Bit (MSB) page to store MSB data. Furthermore, when the memory cells are implemented with multi-level cells, each configured to store three-bit data, each of the word lines WL1 to WL4 may correspond to an LSB page to store LSB data, a Central Significant Bit (CSB) page to store CSB data, and an MSB page to store MSB data.

Figure 3A:
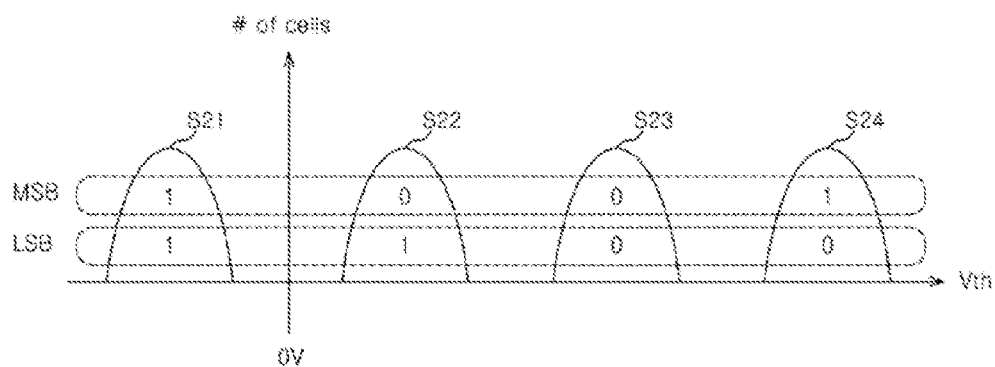
FIGS. 3A and 3B are diagrams illustrating threshold voltage distributions of memory cells depending on data stored therein.
Figure 3B:
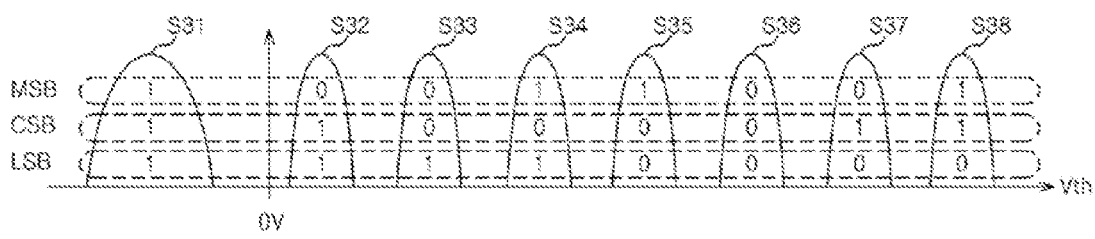

FIGS. 3A and 3B are diagrams illustrating threshold voltage distributions of memory cells depending on data stored therein. FIG. 3A illustrates an example in which two-bit data are stored in each memory cell. FIG. 3B illustrates an example in which three-bit data are stored in each memory cell.

Referring to FIG. 3A, the memory cells may have different threshold voltages depending on the two-bit data stored therein, and form a predetermined range of threshold voltage distributions S21 to S24. For example, when two-bit data "11" are stored in memory cells or the memory cells are erased, the memory cells may form the threshold voltage distribution S21. Furthermore, when two-bit data "01" are stored in memory cells, the memory cells may form the threshold voltage distribution S22. The threshold voltage may decrease in the order of the threshold voltage distributions S24 to S21. That is, the threshold voltage distribution S24 may have the highest threshold voltage.

Referring to FIG. 3B, the memory cells may have different threshold voltages depending on three-bit data stored therein, and form a predetermined range of threshold voltage distributions S31 to S38. For example, when three-bit data "111" are stored in memory cells or the memory cells are erased, the memory cells may form the threshold voltage distribution S31. Furthermore, when three-bit data "011" are stored in memory cells, the memory cells may form the threshold voltage distribution S32. The threshold voltage may decrease in order of the threshold voltage distributions S38 to S31. That is, the threshold voltage distribution S38 may have the highest threshold voltage.

Figure 4A:
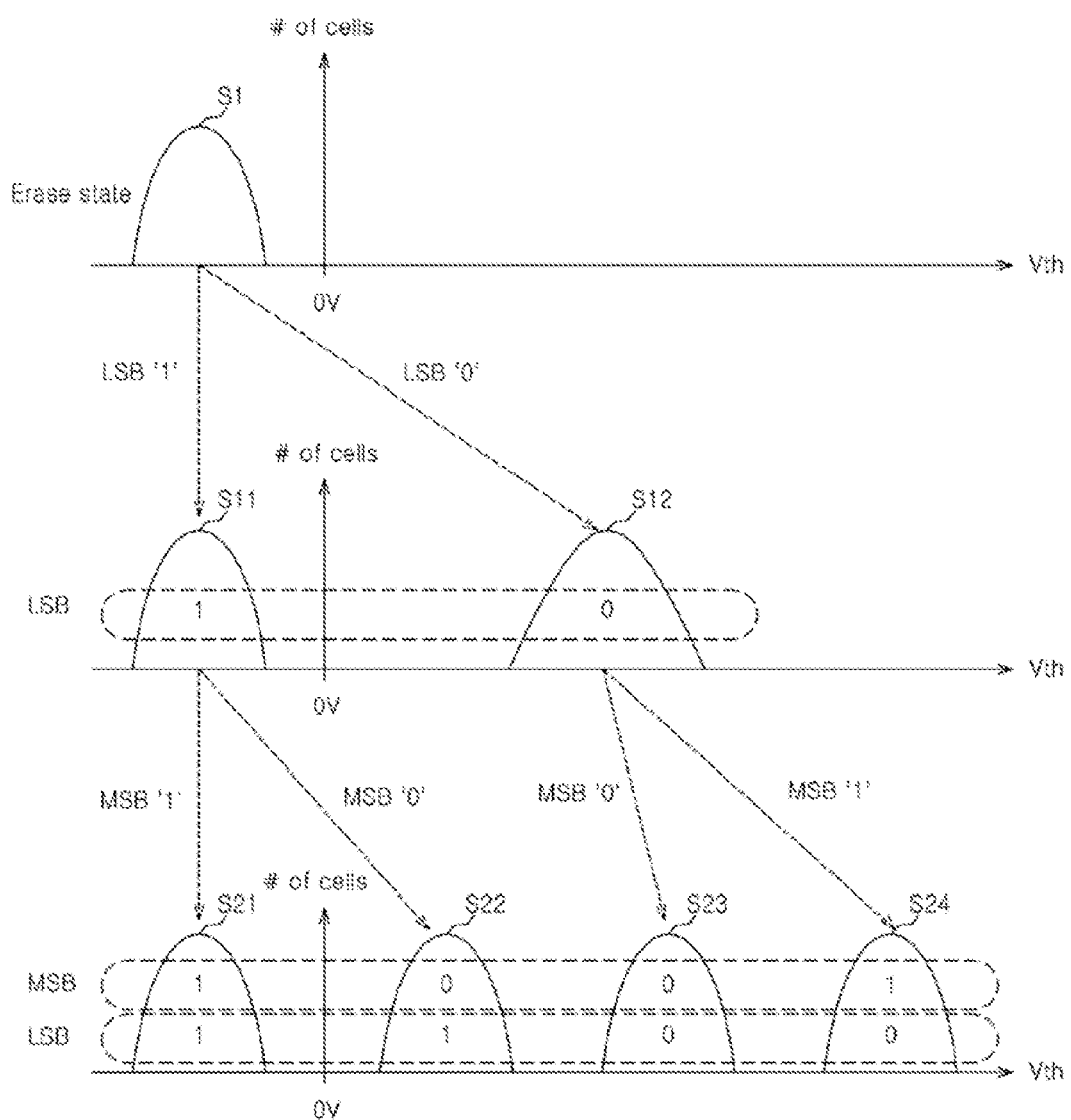
FIGS. 4A and 4B are diagrams illustrating changes threshold voltage distributions of memory cells according to a write operation.
Figure 4B:
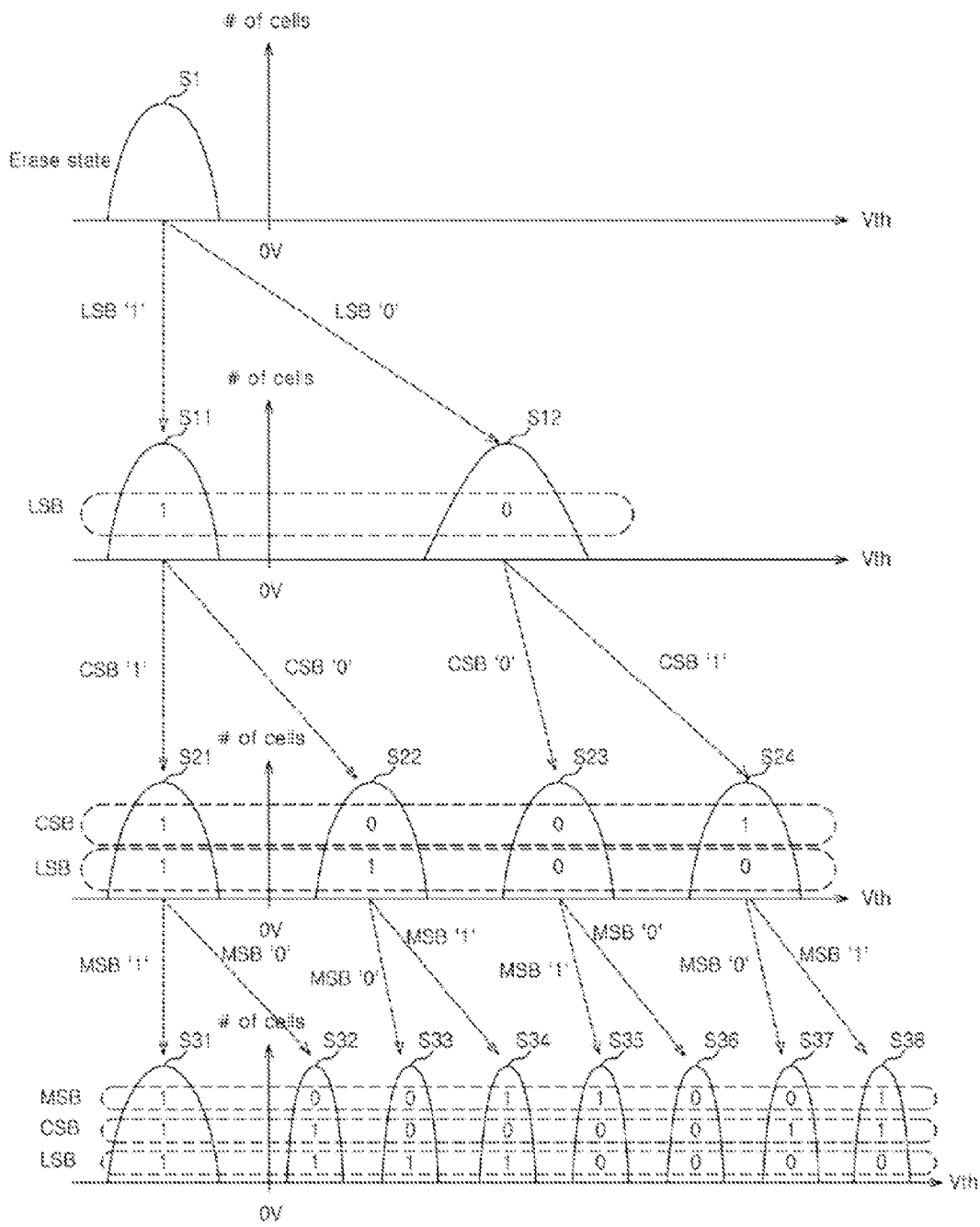

FIGS. 4A and 4B are diagrams illustrating changes irk the threshold voltage distribution of memory cells according to a write operation. FIG. 4A illustrates when two-bit data are stored in each memory cell, and FIG. 4B illustrates when three-bit data are stored in each memory cell.

Referring to FIG. 4A, the memory cell may have a threshold voltage corresponding to a first threshold voltage distribution S1, when the memory cell is erased. In the erased state, LSB data may be first written to the memory cell. Then, MSB data may be written to the memory cell when the LSB data is written.

The memory cell which had been in the erased state may have a threshold voltage corresponding to a threshold voltage distribution S11 or S12 based on the written LSB data. The memory cell may have a threshold voltage corresponding to the threshold voltage distribution S11 when the LSB data of "1" is written, or have a threshold voltage corresponding to the threshold voltage distribution S12 when the LSB data of "0" is written.

The memory cell to which the LSB data was written may have a threshold voltage corresponding to any one of the threshold voltage distributions S21 to S24 based on MSB data which is additionally written. For example, the memory cell to which the LSB data of "1" is written may have a threshold voltage corresponding to the threshold voltage distribution S21 when MSB data of "1" is additionally written, or have a threshold voltage corresponding to the threshold voltage distribution S22 when MSB data of "0" is additionally written.

Referring to FIG. 4B, one-bit data may be additionally written as seen in FIG. 4A, that is, where two-bit data are written to each memory cell. A memory cell to which LSB data and CSB data are written may have a threshold voltage corresponding to any one of the threshold voltage distributions S31 to S38 based on MSB data which is additionally written. For example, a memory cell to which LSB data and CSB data of "11" are written may have a threshold voltage corresponding to the threshold voltage distribution S31 when MSB data of "1" is additionally written, or have a threshold voltage corresponding to the threshold voltage distribution S32 when MSB data of "0" is additionally written.

In order to store data in a memory cell, that is, to control the memory cell to have a predetermined threshold voltage, the nonvolatile memory device 200 may apply a preset voltage to a word line and bit line corresponding to the memory cell. The nonvolatile memory device 200 may apply a program permission voltage to the corresponding bit line in order to increase the threshold voltage of the memory cell, according to an Incremental Step Pulse Program (ISPP) method, and apply a program inhibition voltage to the corresponding bit line in order to retain the threshold voltage of the memory cell.

Hereafter, it is assumed that write operations on memory cells are performed by changing the threshold voltages thereof as illustrated in FIGS. 4A and 4B. However, the embodiments of the present disclosure are not limited thereto.

Figure 5A:
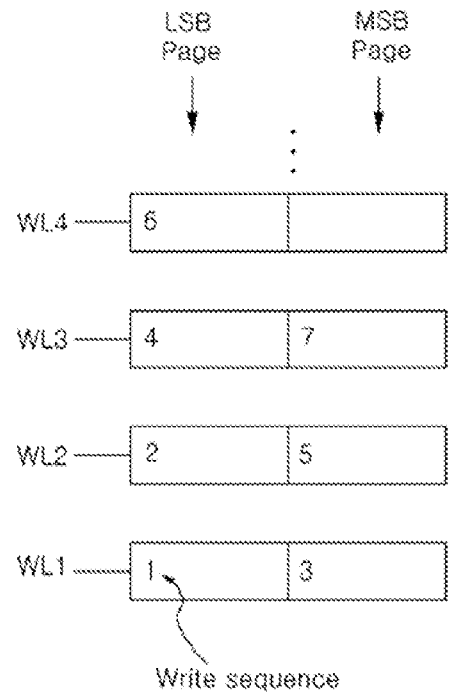
FIGS. 5A and 5B are diagrams illustrating a write sequence for a plurality of pages corresponding to one memory block.
Figure 5B:
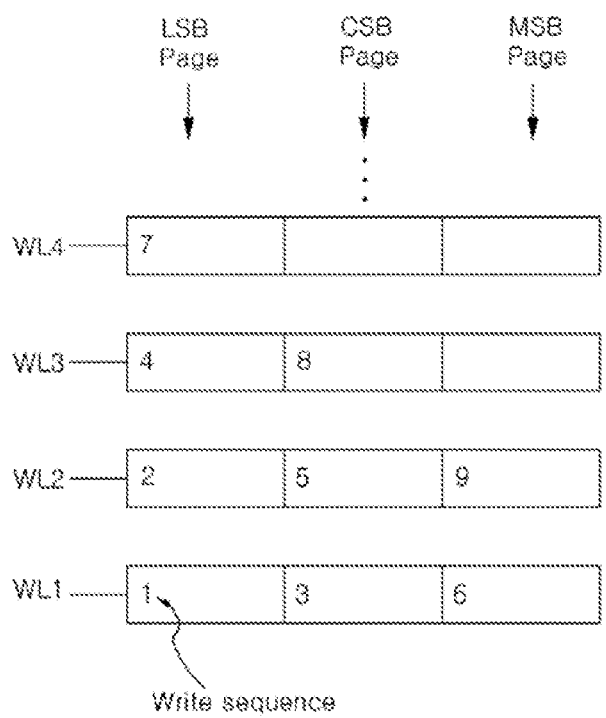

FIGS. 5A and 5B are diagrams illustrating a write sequence for a plurality of pages corresponding to one memory block. FIG. 5A illustrates where two-bit data are stored in each memory cell. FIG. 5A illustrates LSB pages and MSB pages corresponding to the first to fourth word lines WL1 to WL4, respectively. FIG. 5B illustrates where three-bit data are stored in each memory cell. FIG. 5B illustrates LSB pages, CSB pages, and MSB pages corresponding to the first to fourth word lines WL1 to WL4, respectively.

A plurality of pages corresponding to one memory block may be written according to a write sequence. The write sequence may be set to minimize interference effects between pages or word lines. For pages corresponding to one word line, write operations may be discontinuously performed.

Referring to FIG. 5A, write operations may be performed in order of the LSB page of the first word line WL1, the LSB page of the second word line WL2, the MSB page of the first word line WL1, the LSB page of the third word line WL3, the MSB page of the second word line WL2, the LSB page of the fourth word line WL4, and the MSB page of the third word line WL3, for example.

Referring to FIG. 5B, write operations may be performed in order of the LSB page of the first word line WL1, the LSB page of the second word line WL2, the CSB page of the first word line WL1, the LSB page of the third word line WL3, the CSB page of the second word line WL2, the MSB page of the first word line WL1, the LSB page of the fourth word line WL4, the CSB page of the third word line WL3, and the MSB page of the second word line WL2, for example.

Figure 6:
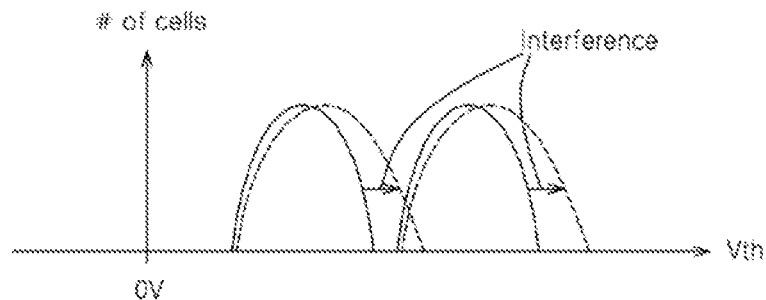
FIG. 6 is a diagram illustrating a change in threshold voltage distributions of memory cells due to interference therebetween.

FIG. 6 is a diagram illustrating a change in threshold voltage distributions of memory cells due to interference therebetween.

A memory cell may be affected by interference from adjacent memory cells, the interference causing a change in the threshold voltage of the memory cell. When data is stored in an adjacent memory cell after a target memory cell has achieved a first threshold voltage, the target memory cell may be affected by interference from the adjacent memory cell, and then have a second threshold voltage that is different from the first threshold voltage. According to the write sequence described with reference to FIG. 5A, the MSB page of the third word line WL3 is written after the LSB page and the MSB page of the second word line WL2 are written. Thus, the memory cells of the second word line WL2 may be affected by interference from the memory cells of the third word line WL3, after having a predetermined threshold voltage. As illustrated in FIG. 6, the target memory cell, which has been affected by interference from the adjacent memory cell, may have a shifted threshold voltage distribution that is due to the interference. The adjacent memory cell may be affected by interference from a memory cell that is written subsequently to the adjacent memory cell according to the write sequence.

Depending on data written to adjacent memory cells, the threshold voltages of the adjacent memory cells may non-uniformly increase. For example, referring back to FIG. 4A, when MSB data to be written to an adjacent memory cell is "1", the threshold voltage of the adjacent memory cell in which LSB data of "1" has been stored may increase by zero. When MSB data to be written to the adjacent memory cell is "0", the threshold voltage of the adjacent memory cell in which the LSB data of "1" has been stored may increase by a positive value.

When MSB data is written, adjacent memory cells having non-uniform threshold voltage increases may have non-uniform interference on target memory cells. Specifically, when MSB data is written, an adjacent memory cell having a significant threshold voltage increase, for example, an adjacent memory cell storing "01" or "10", may have significant interference on a target memory cell. On the other hand, when MSB data is written, an adjacent memory cell having an insignificant threshold voltage increase or a threshold voltage increase of zero, for example, an adjacent memory cell storing "11" or "00", may produce no interference on target memory cells.

As illustrated in FIG. 6, the target memory cells affected by the non-uniform interference may form a threshold voltage distribution of which the right edge is significantly shifted in comparison to the left edge. The significantly shifted right edge may overlap a threshold voltage distribution adjacent to the right side thereof. The target memory cells forming the overlapping threshold voltage distribution may cause an error bit or a read fail.

Figure 7A:
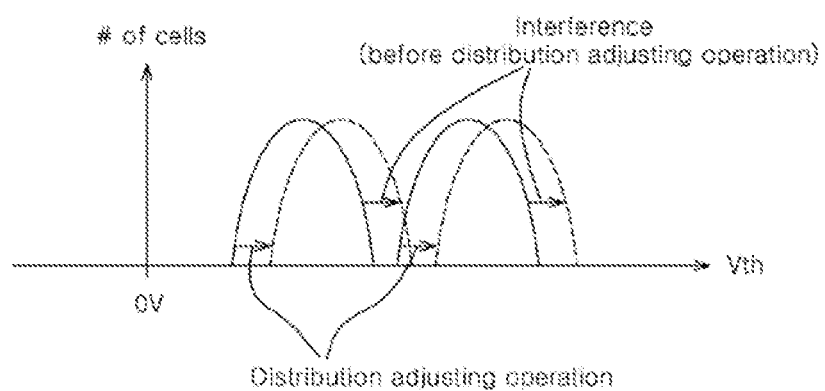
FIG. 7A illustrates threshold voltage distributions of target memory cells when interference effects are improved through a distribution adjusting operation on adjacent memory cells according to an embodiment of the present disclosure.
Figure 7B:
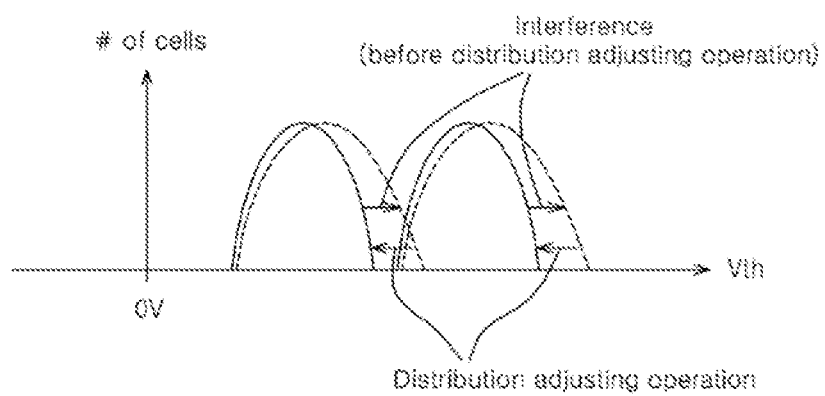
FIG. 7B illustrates threshold voltage distributions of target memory cells when interference effects are removed through a distribution adjusting operation on adjacent memory cells according to an embodiment of the present disclosure.

FIG. 7A illustrates threshold voltage distributions of target memory cells when interference effects are improved through a distribution adjusting operation on adjacent memory cells according to an embodiment of the present disclosure. FIG. 7B illustrates threshold voltage distributions of target memory cells when interference effects are removed through a distribution adjusting operation on adjacent memory cells according to an embodiment of the present disclosure.

Referring to FIG. 7A, the adjacent memory cells may have threshold voltages adjusted through the distribution adjusting operation for improving the interference effects according to an embodiment of the present disclosure. Thus, the adjacent memory cells may have uniform interference on the target memory cells. The target memory cells affected by the uniform interference from the adjacent memory cells may form a threshold voltage distribution with right and left edges that are uniformly shifted, as illustrated in FIG. 7A. The target memory cells affected by uniform interference from the adjacent memory cells may form threshold voltage distributions with sufficiently secured intervals between. That is, the threshold voltage distributions of the target memory cells may have a sufficient read margin. Thus, data reliability may be improved.

Referring to FIG. 7B, the adjacent memory cells may have threshold voltages adjusted through the distribution adjusting operations for removing interference effects according to an embodiment of the present disclosure. Thus, the adjacent memory cells may not interfere with the target memory cells. Since the target memory cells are not affected by the adjacent memory cells, the target memory cells may form threshold voltage distributions which are recovered to the original states as illustrated in FIG. 7B. Thus, data reliability may be improved.

FIGS. 8A and 8B illustrate changes in threshold voltage distributions of adjacent memory cells through a distribution adjusting operation according to an embodiment of the present disclosure. FIG. 8A illustrates two-bit data stored in each adjacent memory cell, and FIG. 8B illustrates three-bit data stored in each adjacent memory cell.

As described above, the threshold voltages of the adjacent memory cells may non-uniformly increase when MSB data is written. However, the threshold voltages of adjacent memory cells having insignificant threshold voltage increases or threshold voltage increases of zero when write operations on the MSB data were performed may be raised through distribution adjusting operations. Thus, the threshold voltage increases of the adjacent memory cells may be more uniform. The adjacent memory cells having more uniform threshold voltage increases may have more uniform interference on target memory cells. Thus, the interference effects may improve.

The adjacent memory cells may have threshold voltages adjusted through the distribution adjusting operation. The threshold voltages of the adjacent memory cells, on which the distribution adjusting operation is performed, may be maintained or raised.

Specifically, a threshold voltage of an adjacent memory cell, which has had a significant threshold voltage increase when the MSB data was written, may be maintained through the distribution adjusting operation. In other words, the threshold voltage of the adjacent memory cell, which has already caused interference on the target memory cell before the distribution adjusting operation, may be maintained through the distribution adjusting operation. The adjacent memory cell of which the threshold voltage is maintained through the distribution adjusting operation may continuously interfere with the target memory cell, even after the distribution adjusting operation is performed. The threshold voltage of the adjacent memory cell may be maintained by retaining data written to the adjacent memory cell without changing the data. Depending on embodiments, an adjacent memory cell having a significant threshold voltage increase may indicate an adjacent memory cell having a threshold voltage increase equal to or greater than a reference value.

Furthermore, a threshold voltage of an adjacent memory cell, which has had a threshold voltage increase of zero or an insignificant threshold voltage increase when the MSB data was written, may be raised through the distribution adjusting operation. In other words, the threshold voltage of the adjacent memory cell, which has had no interference or insignificant interference on the target memory cell before the distribution adjusting operation, may be raised through the distribution adjusting operation. The adjacent memory cell of which the threshold voltage is raised through the distribution adjusting operation may additionally interfere with the target memory cell, after the distribution adjusting operation is performed. The threshold voltage of the adjacent memory cell may be raised by changing the MSB data written in the adjacent memory cell. In some instances, an adjacent memory cell having an insignificant threshold voltage increase may indicate an adjacent memory cell having a threshold voltage increase less than the reference value.

Referring to FIG. 8A, the threshold voltage of the adjacent memory cell which has already had additional interference on a target memory cell before the distribution adjusting operation, that is, an adjacent memory cell storing "01" or "10", may be maintained through the distribution adjusting operation. The threshold voltage of the adjacent memory cell which has already had additional interference on the target memory cell before the distribution adjusting operation, that is, the adjacent memory cell storing "01" or "10", may store the same data through the distribution adjusting operation.

The threshold voltage of the adjacent memory cell which has had no interference or insignificant interference on a target memory cell before the distribution adjusting operation, that is, an adjacent memory cell storing "11" or "00", may be raised through the distribution adjusting operation. The adjacent memory cell which has had no interference or insignificant interference on the target memory cell before the distribution adjusting operation, that is, an adjacent memory cell storing "11" or "00", may store new data through the distribution adjusting operation. For example, an adjacent memory cell which has stored "11" before the distribution adjusting operation may then store "01" through the distribution adjusting operation.

Referring to FIG. 8B the threshold voltage of the adjacent memory cell which has already interfered with a target memory cell before the distribution adjusting operation, that is, an adjacent memory cell storing "011", "101", "000" or "110", may be maintained through the distribution adjusting operation. The adjacent memory cell which has already caused interference on the target memory cell before the distribution adjusting operation, that is, the adjacent memory cell storing "011", "101", "000" or "110", may store the same data through the distribution adjusting operation.

The threshold voltage of the adjacent memory cell which has had no interference or insignificant interference on a target memory cell before the distribution adjusting operation, that is, an adjacent memory cell storing "111" "001", "100" or "010", may be raised through the distribution adjusting operation. The adjacent memory cell which has had no interference or insignificant interference on the target memory cell before the distribution adjusting operation, that is, an adjacent memory cell storing "111", "001", "100" or "010", may store new data through the distribution adjusting operation. For example, the adjacent memory cell which has stored "111" before the distribution adjusting operation may then store "011" through the distribution adjusting operation.

FIGS. 9A and 9B are tables showing read data and adjusted data for the distribution adjusting operation illustrated in FIGS. 8A and 8B. FIG. 9A illustrates two-bit data stored in each adjacent memory cell, and FIG. 9B illustrates three-bit data stored in each adjacent memory cell.

The processor 110 of FIG. 1 may read data from adjacent memory cells. Under control of the controller 100 of FIG. 1, the nonvolatile memory device 200 of FIG. 1 may perform a read operation on an adjacent word line. The read data may indicate data stored in the adjacent memory cells before the distribution adjusting operation is performed.

The processor 110 may generate adjusted data based on the read data. The adjusted data may indicate data that will be stored in the adjacent memory cells.

Specifically, the processor 110 may generate the adjusted data, which is the same as the read data, for an adjacent memory cell which has had a significant threshold voltage increase when MSB data was written. In other words, the processor 110 may generate the adjusted data for an adjacent memory cell, which has already interfered with a target memory cell before the distribution adjusting operation.

The processor 110 may generate the adjusted data by changing the MSB of the read data, that is, the MSB data, for an adjacent memory cell which has had a threshold voltage increase of zero or an insignificant threshold voltage increase when the MSB data was written. In other words, the processor 110 may generate the adjusted data by changing the MSB data of the read data for an adjacent memory cell which has had no interference or insignificant interference on the target memory cell before the distribution adjusting operation.

FIGS. 9A and 9B illustrate the adjusted data which may be generated based on the read data when the distribution adjusting operation is performed as described with reference to FIGS. 8A and 8B, respectively.

The processor 110 may write the adjusted data to the adjacent memory cells. Under control of the controller 100, the nonvolatile memory device 200 may perform a write operation for writing the adjusted data to the adjacent word line. For example, the nonvolatile memory device 200 may perform the write operation for writing the adjusted data to the adjacent word line according to an ISPP method. As a result of the write operation, the adjacent memory cell to which the adjusted data, which is the same as the read data, is written may have the same threshold voltage as before the write operation, and the adjacent memory cell to which the adjusted data generated by changing the MSB data of the read data is written may have an improved threshold voltage.

When the read data from the adjacent memory cells are valid data, the processor 110 may back up the read data into a separate region of the nonvolatile memory device 200.

FIGS. 10A and 10B illustrate changes in threshold voltage distributions of adjacent memory cells through a distribution adjusting operation according to an embodiment of the present disclosure. FIG. 10A illustrates two-bit data stored in each adjacent memory cell, and FIG. 10B illustrates three-bit data stored in each adjacent memory cell.

The adjacent memory cells may have threshold voltages adjusted through the distribution adjusting operation to minimize interference effects on target memory cells. Through the distribution adjusting operation, the threshold voltages of the adjacent memory cells may be recovered to the threshold voltages before the adjacent memory cells have interference on the target memory cells.

According to the write sequence described with reference to FIG. 5A, the MSB page of the third word line WL3 is written after the LSB page and the MSB page of the second word line WL2 are written. Thus, the memory cells of the second word line WL2 may be affected by additional interference from the memory cells of the third word line WL3, after having a predetermined threshold voltage. A memory cell of the second word line WL2, affected by from a memory cell of the third word line WL3, may have a different threshold voltage from the threshold voltage of the memory cell before the memory cell is affected by the interference. The third word line WL3 causes interference on the second word line WL2 when the MSB page is written. Thus, when the third word line WL3 is restored to the state before the MSB page is written, the third word line WL3 may not interfere with the second word line WL2. That is when the memory cells of the third word line WL3 are restored to where only the LSB data is stored in the memory cells, the third word line WL3 may have no new interference on the second word line WL2.

The threshold voltages of the adjacent memory cells may be restored by performing an erase operation on the adjacent memory cells and performing a write operation for storing the data excluding the MSB data.

Referring to FIG. 10A, a threshold voltage of an adjacent memory cell storing LSB data and MSB data may be restored to a threshold voltage corresponding to the state in which only the LSB data is stored, through the distribution adjusting operation. The adjacent memory cell storing the LSB data and MSB data may store only the LSB data through the distribution adjusting operation. For example, an adjacent memory cell which has stored "11" or "01" before the distribution adjusting operation may store "1" through the distribution adjusting operation.

Referring to FIG. 10B, a threshold voltage of an adjacent memory cell storing LSB data, CSB data, and MSB data may be restored to a threshold voltage corresponding to where only the LSB data and CSB data are stored, through the distribution adjusting operation. The adjacent memory cell storing the LSB data, CSB data, and MSB data may store only the LSB data and CSB data through the distribution adjusting operation. For example, an adjacent memory cell which has stored "111" or "011" before the distribution adjusting operation may store "11" through the distribution adjusting operation.

FIGS. 11A and 11B are tables showing read data and adjusted data for the distribution adjusting operation illustrated in FIGS. 10A and 10B. FIG. 11A illustrates two-bit data stored in each adjacent memory cell, and FIG. 11B illustrates three-bit data stored in each adjacent memory cell.

The processor 110 of FIG. 1 may read data from adjacent memory cells. Under control of the controller 100 of FIG. 1, the nonvolatile memory device 200 of FIG. 1 may perform a read operation on an adjacent word line. The read data may indicate data stored in the adjacent memory cells before the distribution adjusting operation is performed.

The processor 110 may generate adjusted data based on the read data. The adjusted data may indicate data to be stored in the adjacent memory cells. The processor 110 may generate adjusted data based on the bits of the read data excluding the MSB bit, that is, the MSB data.

FIGS. 11A and 11B illustrate the adjusted data which may be generated based on the read data when the distribution adjusting operation is performed as described with reference to FIGS. 10A and 10B, respectively.

The processor 110 may erase the adjacent memory cells. Under control of the controller 100, the nonvolatile memory device 200 may perform an erase operation on an adjacent word line. For example, the nonvolatile memory device 200 may perform an erase operation on only the adjacent word line. For example, the nonvolatile memory device 200 may collectively perform an erase operation on adjacent word lines on which write operations are performed after a write operation on a target word line, in a memory block including the target word line and the adjacent word lines.

The processor 110 may write the adjusted data to the adjacent memory cells. Under control of the controller 100, the nonvolatile memory device 200 may perform a write operation for writing the adjusted data to the adjacent word line.

When the read data from the adjacent memory cells are valid data, the processor 110 may back up the read data into a separate region of the nonvolatile memory device 200.

Figure 12:
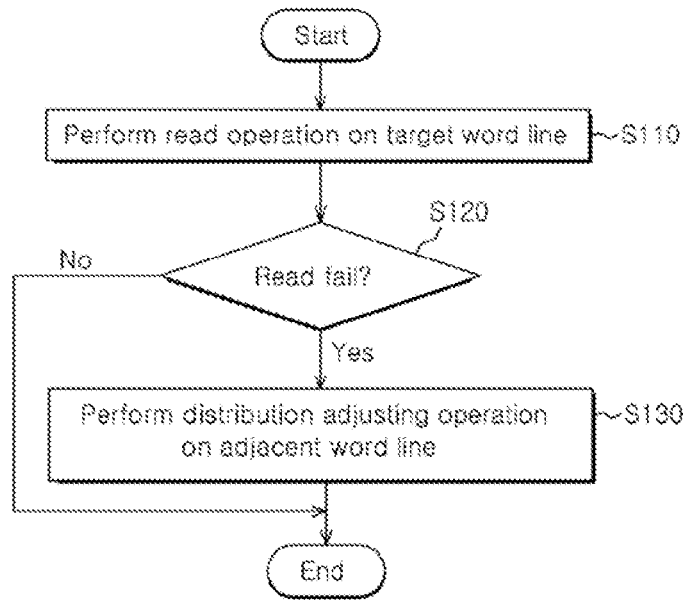
FIG. 12 is a flowchart illustrating an operating method of a data storage device according to an embodiment of the present disclosure.

FIG. 12 is a flowchart illustrating an operating method of the data storage device 10 according to an embodiment of the present disclosure.

Referring to FIGS. 1 and 12, at step S110, the nonvolatile memory device 200 may perform a read operation on a target word line. As a result of the read operation, data stored in target memory cells may be read as read data.

At step S120 it is determined whether a read fail occurred based on a result of the read operation for the target word line at step 110. The read fail may occur when a result of an error correction operation on the read data is a fail, i.e., when the number of error bits occurring in the read data exceeds the error correction ability of the error correction unit 130. The error bits of the read data may occur due to interference of adjacent memory cells on the target memory cells. A read fail does not occur when the read data contains no errors or when the errors are corrected. When the read fail occurs (Yes), the procedure may proceed to step S130. When no read fail occurs (No), the procedure may be ended.

At step S130, the processor 110 may perform a distribution adjusting operation on one or more word lines adjacent to the target word line. The distribution adjusting operation may be performed to improve or remove the interference effects of the adjacent word lines on the target word line. The adjacent word lines on which the distribution adjusting operation is performed may include a word line on which a write operation is performed subsequently to the target word line.

Figure 13:
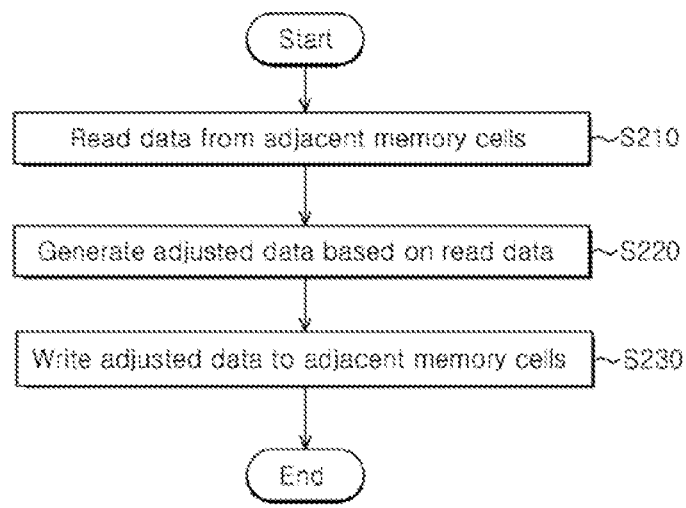
FIG. 13 is a flowchart illustrating a method in which the data storage device performs a distribution adjusting operation according to an embodiment of the present disclosure.

FIG. 13 is a flowchart illustrating a method in which the data storage device 10 performs a distribution adjusting operation according to an embodiment of the present disclosure. The data storage device 10 may perform the distribution adjusting operation to improve interference effects of an adjacent word line on a target word line.

Referring to FIG. 13, at step S210, the processor 110 may read data from adjacent memory cells.

At step S220, the processor 110 may generate adjusted data based on the read data. The processor 110 may generate the adjusted data, which is the same as the read data, the adjusted data corresponding to an adjacent memory cell which has already interfered with a target memory cell before the distribution adjusting operation. Alternatively, the processor 110 may generate the adjusted data by changing MSB data of the read data, the adjusted data corresponding to an adjacent memory cell which has had no interference or insignificant interference on the target memory cell before the distribution adjusting operation.

At step S230, the processor 110 may write the adjusted data to the adjacent memory cells.

Figure 14:
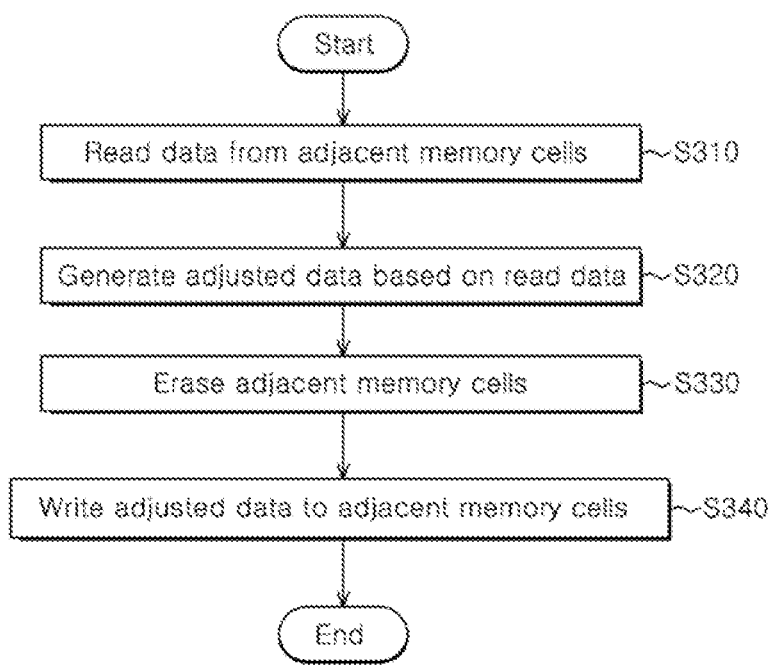
FIG. 14 is a flowchart illustrating a method in which the data storage device performs a distribution adjusting operation according to an embodiment of the present disclosure.

FIG. 14 is a flowchart illustrating a method in which the data storage device 10 performs a distribution adjusting operation according to an embodiment of the present disclosure. The data storage device 10 may perform the distribution adjusting operation to remove interference effects of an adjacent word line on a target word line.

Referring to FIG. 14, at step S310, the processor 110 may read data from adjacent memory cells.

At step S320, the processor 110 may generate adjusted data based on the read data. The processor 110 may generate the adjusted data including bits of the read data excluding MSB data.

At step S330, the processor 110 may erase the adjacent memory cells.

At step S340, the processor 110 may write the adjusted data to the adjacent memory cells.

According to the embodiments of the present invention, the data storage device may improve data reliability.

While certain embodiments have been described above, it will be understood to those skilled in the art that the embodiments described are examples only. Accordingly, the data storage device described herein should not be limited based on the described embodiments. Rather, the data storage device described herein should only be limited in light of the claims that follow when taken in conjunction with the above description and accompanying drawings.

What is claimed is:

1. A data storage device comprising:
a nonvolatile memory device comprising first and second memory cells that are adjacent to each other; and
a controller suitable for adjusting a threshold voltage of the second memory cell when a read operation on the first memory cell fails, so that a threshold voltage of the first memory cell is adjusted,
wherein the controller reads data from the second memory cell, generates adjusted data based on the read data, and writes the adjusted data to the second memory cell, when adjusting the threshold voltage of the second memory cell.

2. The data storage device of claim 1, wherein the controller generates the adjusted data by changing a most significant bit of the read data or uses the read data in its original form.

3. The data storage device of claim 1, wherein the controller generates the adjusted data by using the read data when the threshold voltage of the second memory cell increases by a value equal to or greater than a reference value while a most significant bit of the read data is written to the second memory cell.

4. The data storage device of claim 1, wherein the controller generates the adjusted data by changing a most significant bit of the read data when the threshold voltage of the second memory cell increases by a value less than a reference value while the most significant bit of the read data is written to the second memory cell.

5. The data storage device of claim 1, wherein the controller generates the adjusted data based on bits of the read data excluding a most significant bit.

6. The data storage device of claim 5, wherein the controller erases the second memory cell before writing the adjusted data to the second memory cell.

7. The data storage device of claim 1, wherein the first and second memory cells are coupled to different word lines.

8. An operating method of a data storage device, comprising:
performing a read operation on a first memory cell; and
adjusting a threshold voltage of a second memory cell, which is adjacent to the first memory cell, when the read operation fails, so that a threshold voltage of the first memory cell is adjusted,
wherein the adjusting of the threshold voltage of the second memory cell comprises:
reading data from the second memory cell;
generating adjusted data based on the read data; and
writing the adjusted data to the second memory cell.

9. The operating method of claim 8, wherein the threshold voltage of the second memory cell is maintained or raised during the adjusting of the threshold voltage of the second memory cell.

10. The operating method of claim 9, wherein the threshold voltage of the second memory cell is maintained when the threshold voltage of the second memory cell increases by a value equal to or greater than a reference value while a most significant bit is written to the second memory cell.

11. The operating method of claim 9, wherein the threshold voltage of the second memory cell is raised when the threshold voltage of the second memory cell increases by a value less than a reference value while a most significant bit is written to the second memory cell.

12. The operating method of claim 8, wherein the adjusting of the threshold voltage of the second memory cell comprises restoring the threshold voltage of the second memory cell to the threshold voltage before a most significant bit is written to the second memory cell.

13. An operating method of a data storage device, comprising:
performing a read operation on a first memory cell; and
changing data stored in a second memory cell, which is adjacent to the first memory cell, when the read operation fails, so that data stored in the first memory cell is changed,
wherein the changing of the data stored in the second memory cell comprises:
reading the data from the second memory cell;
generating adjusted data based on the read data; and
writing the adjusted data to the second memory cell.

14. The operating method of claim 13, wherein the adjusted data is generated by changing a most significant bit of the read data or using the read data in its original form.

15. The operating method of claim 13, wherein the adjusted data is generated based on bits of the read data excluding a most significant bit.

16. The operating method of claim 15, wherein the changing of the data stored in the second memory cell further comprises erasing the second memory cell before writing the adjusted data to the second memory cell.

17. The operating method of claim 13, further comprising:
backing up the read data when the read data is valid data.

18. The operating method of claim 13, wherein the second memory cell is written subsequently to the first memory cell.

* * * * *